United States Patent
Johnson

(10) Patent No.: US 6,169,687 B1
(45) Date of Patent: Jan. 2, 2001

(54) HIGH DENSITY AND SPEED MAGNETO-ELECTRONIC MEMORY FOR USE IN COMPUTING SYSTEM

(76) Inventor: Mark B. Johnson, 7742 Jewelweed Ct., Springfield, VA (US) 22512

(*) Notice: Under 35 U.S.C. 154(b), the term of this patent shall be extended for 0 days.

(21) Appl. No.: 09/005,855

(22) Filed: Jan. 12, 1998

Related U.S. Application Data

(63) Continuation-in-part of application No. 08/425,884, filed on Apr. 21, 1995, now Pat. No. 5,629,549, and a continuation-in-part of application No. 08/493,815, filed on Jun. 22, 1995, now Pat. No. 5,565,695, and a continuation-in-part of application No. 08/643,805, filed on May 6, 1996, now Pat. No. 5,652,445, and a continuation-in-part of application No. 08/643,804, filed on May 6, 1996, now Pat. No. 5,654,566, and a continuation-in-part of application No. 08/806,028, filed on Feb. 24, 1997, now Pat. No. 6,064,083.

(51) Int. Cl.$^7$ ................................................ G11C 11/14

(52) U.S. Cl. ........................ 365/171; 365/9; 365/158

(58) Field of Search .................... 365/171, 9, 158; 257/295

(56) References Cited

U.S. PATENT DOCUMENTS

| | | | |
|---|---|---|---|
| 4,607,271 | 8/1986 | Popovic et al. | 357/27 |
| 4,823,177 | * 4/1989 | Prinz et al. | 357/27 |
| 5,089,991 | 2/1992 | Matthews | 365/9 |
| 5,237,529 | 8/1993 | Spitzer | 365/158 |
| 5,239,504 | 8/1993 | Brady et al. | 365/157 |
| 5,251,170 | 10/1993 | Daughton et al. | 365/158 |
| 5,289,410 | 2/1994 | Katti et al. | 365/170 |
| 5,329,480 | 7/1994 | Wu et al. | 365/170 |
| 5,396,455 | 3/1995 | Brady et al. | 365/170 |
| 5,420,819 | 5/1995 | Pohm | 365/158 |
| 5,424,236 | 6/1995 | Daughton et al. | 437/52 |
| 5,432,373 | 7/1995 | Johnson | 257/421 |
| 5,452,163 | 9/1995 | Coffey et al. | 360/113 |
| 5,475,277 | 12/1995 | Johnson | 310/156 |
| 5,488,250 | 1/1996 | Henning | 257/421 |
| 5,491,338 | 2/1996 | Spitzer | 250/307 |
| 5,580,814 | 12/1996 | Larson | 437/52 |
| 5,587,943 | * 12/1996 | Torok et al. | 365/158 |

OTHER PUBLICATIONS

James Daughton, "Magnetoresistive Memory Technology", Thin Solid Films, vol. 216, 162 (1992).

R. Meservey, P. M. Tedrow and P. Fulde, Phys. Rev. Lett. 25, 1270 (1970).

P.M. Tedrow and R. Meservey, Phys. Lett. 26, 192 (1971).

P.M. Tedrow and R. Meservey Phys. Rev. B 7, 318 (1973).

Mark Johnson and R. H. Silsbee, Phys. Rev. Lett. 55, 1790 (1985).

Mark Johnson and R. H. Silsbee Phys. Rev. B 35, 4959 (1987).

Mark Johnson and R. H. Silsbee, Phys. Rev. B 37, 5312 (1988).

Mark Johnson and R. H. Silsbee, Phys. Rev. B 37, 5326 (1988).

(List continued on next page.)

Primary Examiner—Son T. Dinh
Assistant Examiner—Tuan T. Nguyen
(74) Attorney, Agent, or Firm—Law +

(57) ABSTRACT

A new type of magneto-electronic element, such as a spin transistor or hybrid hall effect device, can be used to construct memory systems to replace conventional cache, primary, secondary and long term (archival) storage. The magneto-electronic element is non-volatile, and has switching speeds and integration densities that compare favorably with conventional semiconductor random access memories, such as DRAM. In another embodiment, an integrated memory system may be constructed that synthesizes one or more previously disparate levels of conventional memory (i.e., a combination of primary and secondary storage) so that memory organization is further simplified and performance and cost are improved.

68 Claims, 6 Drawing Sheets

OTHER PUBLICATIONS

Mark Johnson, "The All Metal Spin Transistor," I.E.E.E. Spectrum Magazine, vol. 31 No. 5 p. 47 (1994).

Mark Johnson, "The Bipolar Spin Switch," Science 260, 320 (1993).

R. S. Popovi'c, "Hall–effect Devices," Sens. Actuators 17, 39 (1989).

J. De Boeck, J. Harbison et al., "Non–volatile Memory Characteristics of Submicrometer Hall Structures Fabricated in Epitaxial Ferromagnetic MnAl Films on GaAs", Electronics Letters 29, 421 (1993).

Paul Horowitz and Winfield Hill, "The Art of Electronics," Cambridge Unvi. Press, Cambridge U.K. (1980); see p. 328.

* cited by examiner

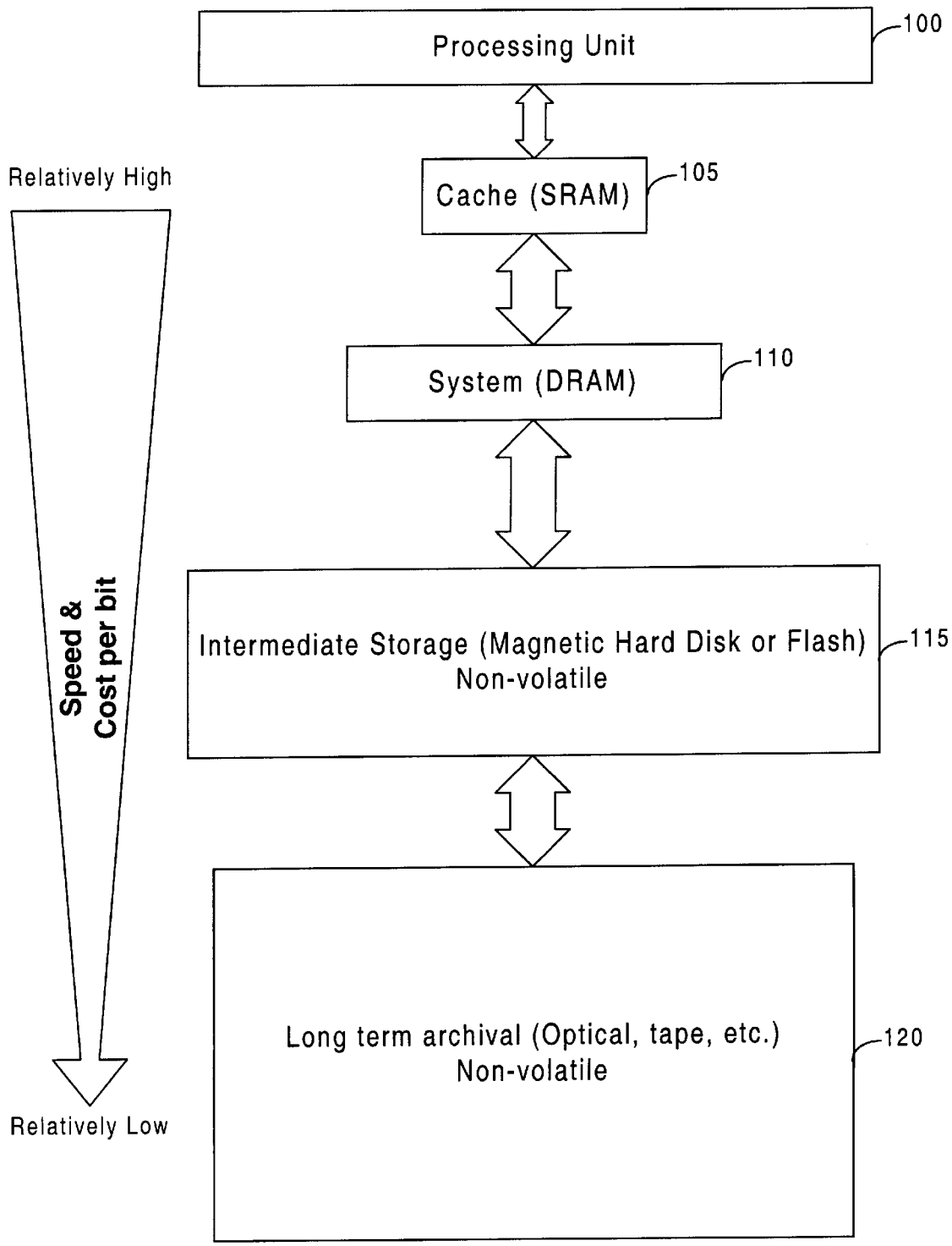
Figure 1 - Prior Art Memory Hierarchy

HIGH DENSITY AND SPEED MAGNETO-ELECTRONIC MEMORY FOR USE IN COMPUTING SYSTEM

RELATED APPLICATIONS

The present application is a continuation in part of the following:

U.S. Pat. No. 5,629,549 filed Apr. 21, 1995; Ser. No. 08/425,884, filed Apr. 21, 1995

U.S. Pat. No. 5,565,695 filed Jun. 22, 1995; Ser. No. 08/493,815, filed Jun. 22, 1995

U.S. Pat. No. 5,652,445 filed May 6, 1996; Ser. No. 08/643,805, filed May 6, 1996

U.S. Pat. No. 5,654,566 filed May 6, 1996; Ser. No. 08/643,804, filed May 6, 1996 and Ser. No. 08/806,028 filed Feb. 24, 1997 now U.S. Pat. No. 6,064,983. The above materials are hereby expressly incorporated by reference herein.

FIELD OF THE INVENTION

This invention relates generally to high speed memories constructed from magneto-electronic devices. Such devices can include magnetic spin transistors, hybrid hall effect devices, etc., and can be constructed in a variety of different ways, including as elements integrated in silicon with conventional semiconductor elements. The new magneto-electronic devices can be implemented as replacements for other conventional memories, including semiconductor random access SRAM, DRAM, Flash, as well as intermediate storage magnetic or optical memory types such as magnetic disk drives, tape drives, optical drives, etc.

BACKGROUND OF THE INVENTION

The breakdown of conventional memory in contemporary computing machines is depicted in FIG. 1. As can be seen there, memory coupled to a processing unit 100 is generally broken up into four classifications: (1) cache memory 105; (2) system memory (primary storage) 110; (3) intermediate (secondary) storage 115; and (4) archival (long term) storage 120.

Each of these types has unique characteristics, requirements and associated costs. The arrow on the left hand side of the figure is intended to illustrate a rough comparison of the speed and cost associated with such systems, and the various blocks shown for cache, system, intermediate and long term are also roughly scaled in size in the diagram to denote the concept of relative capacity differences in such systems as well.

For example, cache memory 105 usually resides onboard a microprocessor (or similar computing device), is extremely fast (less than 10 ns access time), expensive, and volatile. Typically, SRAM technology has been used to date for such implementations. This type of memory is usually used for storing data and instructions that are most frequently used by the system to accelerate execution speeds of operating system/applications programs. An example of this is a software loop comprised of multiple instructions which needs to be executed frequently. To avoid having to re-load this entire routine every time it is needed, it is common to cache such routines directly onboard the microprocessor. To a large extent caches make use of the spatial temporalism inherent in programs; i.e., that if an instruction is recently executed, that same instruction, or another instruction close to it (from a logical address space perspective) is likely to be needed soon as well. For this reason, it is common to pre-fetch and cache a number of instructions and related data in anticipation of their later use by the processor.

Main or system memory 110 (sometimes called primary storage as well) typically refers to memory implemented outside the microprocessor chip, and which is shared with other devices, such as other processors. The general functional constraints on this memory are related to the fact that it need only be fast enough to feed program instructions to a computing device (such as a microprocessor, RISC processor) or data to peripheral devices at a rate specified by such devices and which is otherwise permissible on a system bus. In other words, instructions and data are usually loaded from the main memory system 110 directly through a system bus to registers, latches, etc. on the processing unit or peripheral device for later processing. System memory 110 is usually DRAM based technology, and while somewhat slower (30–40 ns access time) than cache, is much less expensive, resides off-chip, but is also unfortunately volatile. Generally speaking, the bulk of operating system and applications programs are run from system memory 110, and logic onboard the computing device is generally responsible for moving data and instructions into the onboard cache 105 as appropriate. In rough terms, system memory 110 capacity is typically on the order of 10 to 100 times larger than the cache memory 105 used within a computing system.

Secondary storage 115 includes such items as floppy disks, hard drives, and assorted magnetic media board, which have access times in the millisecond range, but which also have the advantage of being non-volatile and relatively inexpensive compared to the above semiconductor memories from a dollars/megabyte perspective. The bulk of operating system and user application programs is stored with this type of media, and is only accessed when needed. Such storage is also accessible through the system bus, but the data and instructions here must first be loaded into main memory where they can be accessed at the necessary speed by the processing unit. Again, in rough terms, secondary storage 115 capacity can be tens, hundreds or thousands of times larger than the primary memory 110 used within a computing system. Generally speaking, high capacity and low cost are the most important aspect of secondary storage 115, while speed is the most important characteristic of primary memory 110 and cache memory 105. At present, magnetic hard disk is the leading technology used for secondary storage, but there are a number of electro-mechanical, tribological and electrical factors which are limiting the potential of such devices to achieve higher speeds and densities. For example, significantly challenging engineering problems exist in improving the density of recording as well as size, sensitivity and bandwidth of read heads in such devices.

Some inroads into intermediate non-volatile storage have been made with semiconductor Flash memories, but for the most part their speed, density and cost considerations have constrained them to limited environments.

Finally, archival memory 120 is also non-volatile, substantially slower and cheaper than secondary storage. This type of media includes CD ROMs, optical disks, magnetic tape, etc., and usually data and programs that are only rarely needed, or which need to be stored long term, are loaded here. Capacity and cost are the primary considerations in such systems, and they can be many times larger than a secondary storage system.

All of these types of memory can co-exist within a single computing system, with each performing its role in accordance roughly with the discussion above. However, each type of memory system is made with completely different materials and manufacturing techniques. A hard drive, for example, includes a complex combination of interacting electrical and moving mechanical components, while a DRAM has no moving parts and is manufactured entirely using conventional semiconductor processing techniques. Furthermore, each technology has associated controller requirements, and must be connected to "other" memory systems through a bus and often using complicated interface technologies. Thus, within any conventional system, there are not only four different types of memory technology, but also four different types of controllers and four different types of data transfer interfaces all of which attempt to cooperate on a single bus. The manufacturers of separate memory technologies generally do not coordinate with each other, because, to date, there is no available technology that bridges their respective operating domains.

It is apparent, nevertheless, that it would be extremely advantageous to impart non-volatility to DRAM and similarly to impart random access capability and higher operations speed to magnetic disk technology. For example, when beginning operation of a machine, users of conventional computing systems typically must endure several minutes of "boot-up" sequences during which time necessary drivers, operating system procedures, etc. are transferred or loaded from magnetic disk to system memory where they can be executed. Furthermore, anytime an application program or data not already in system memory is required, another seek and load must be performed on the magnetic disk.

Along the same lines, it would be extremely beneficial if the cost and complexity associated with four different types of controllers and interfaces could be eliminated.

There is a tremendous unfulfilled need, therefore, for a simpler, faster, unified system memory technology that combines the best of high-speed solid state and magnetic non-volatile memories.

SUMMARY OF THE INVENTION

An object of the present invention therefore is to provide a novel magneto-electronic memory device that can be used as a replacement for any of the conventional memory elements used in cache, system, intermediate, and long term memory storage devices.

Another object of the present invention is to provide a novel magneto-electronic memory device that can be used as a non-volatile element in solid state random access memory systems that traditionally have not had such characteristics, such as in high speed computing cache and system memory systems.

Another object of the present invention is to provide an integrated memory system that performs at a functional level sufficiently well so that it can replace one or more levels of traditional memory, so that performance, cost, flexibility, integration density, etc. are improved over prior art systems that combine and mix memory types (i.e., cache+DRAM, DRAM+bard disk, etc.)

These objectives and others are achieved by a new magneto-electronic (ME) memory which can be used in a variety of electronic systems, including conventional computing systems, microprocessors, hand held systems, and the like. The ME memory includes a plurality of memory cells, which cells include either a magnetic spin transistor or hybrid hall effect device for storing data values. An access circuit coupled to the ME memory interfaces with and provides necessary data values to the system in question.

In a cache embodiment, the ME memory is coupled to a computing system for storing data and/or instructions recently used by such system. In a primary storage embodiment, the memory store instructions and/or data that can be accessed for immediate processing by such system through a system bus. Some implementations may utilize a form factor in which the ME memory is comprised of two or more modules of magnetic memory, each of the modules including an array of magnetic spin transistor memory cells for storing and retrieving data values.

Other embodiments of the ME memory include secondary storage devices that store programs and/or data which can be loaded into a system memory and then accessed by a computing system. To maintain compatibility with preexisting systems, ME memories of this type may include onboard access circuits that emulate a conventional magnetic hard disk so that the present invention can be used in PCMCIA and similar environments.

In an integrated memory embodiment, the ME memory of the present invention can replace more than one level of conventional memory at one time. For example, it can operate both as a cache and primary storage memory, or as a primary and secondary storage device, etc. An integrated memory of this type may nevertheless be partitioned into ME devices of disparate characteristics in a manner akin to that done with semiconductor memories, so that a primary storage portion may have a data access time substantially less than that for a secondary storage portion of the same ME device.

For embodiments where isolation is necessary, elements such as diodes, FETs, etc can be used and even integrated as part of the ME "cell" to enhance bit density. Based on experimental results and observations by the applicant, it is conservatively estimated that data values can be written to and read from such cells in less than 5 nanoseconds. In some instances it is expected that read times of less than 1 nanosecond can be obtained. Furthermore, with reasonable process techniques it is projected that the integration density of such cells is at least 500 megabits/cm$^2$, and is expected to improve directly in correlation with advances in lithographic arts. The ME memories of the present invention are especially suited therefore for high speed and non-volatile applications such as in personal computers, hand-held computers, large scale scientific computers, telephones, printers and other common consumer electronic devices.

BRIEF DESCRIPTION OF THE DRAWINGS

FIG. 1 is a visual depiction of the various levels of memory systems found in a typical prior art computing system;

DETAILED DESCRIPTION OF THE INVENTION

General background explanation of ME devices

Figure 2A:
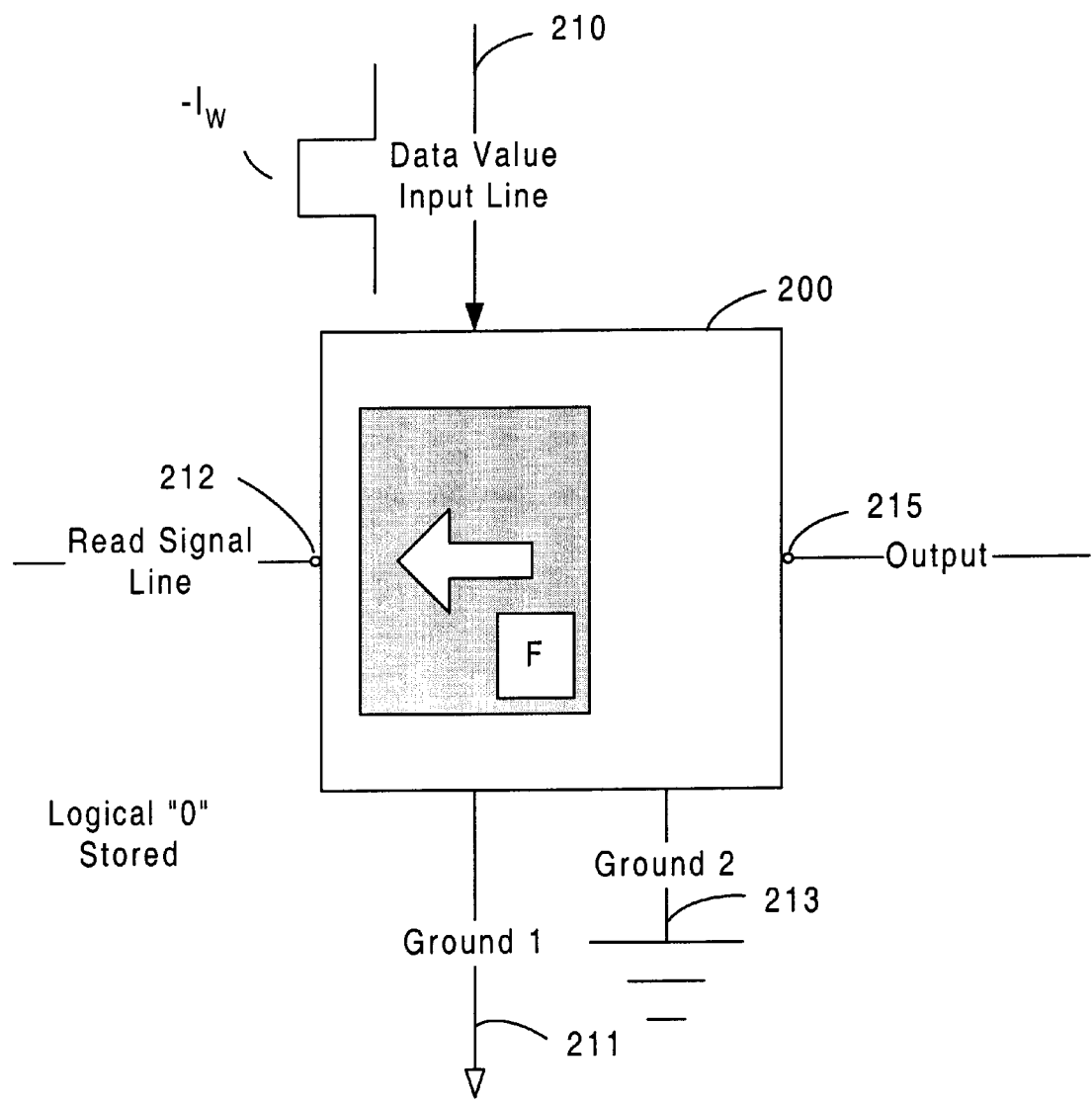
FIGS. 2a–2b are block diagram depictions of a magneto-electronic memory cell used in the present invention.

For ease of understanding, the present disclosure introduces some shorthand graphical notations and definitions of the ME devices previously discussed at length in my prior patents. For example, FIG. 2a shows a general shorthand schematic depiction of a ME device 200 which can be advantageously used as a memory device; it could be a Magnetic Spin Transistor (MST), a Hybrid Hall Device (HHD) or similar magneto-electronic device as described in my prior applications listed above. This nomenclature is used throughout the present disclosure and unless otherwise stated, the ME devices described herein generally utilize this same basic structure.

In it simplest form, ME device 200 is considered to be a two state device, with the state determined by the orientation of a ferromagnetic layer F (indicated in shaded form in the figure). In a convenient notation, the magnetization state M of this layer can be left or right as shown by the arrow. The orientation (state) can be set by using the magnetic field associated with short current pulses that are generally referred to as write pulses, L. In a preferred physical implementation a write wire 210 is contiguous with F, typically passing directly over F, and is grounded at a point designated ground 211. As shown here, a positive polarity write pulse (of appropriate magnitude) orients M to the right and a negative polarity write pulse orients M to the left.

Figure 2B:
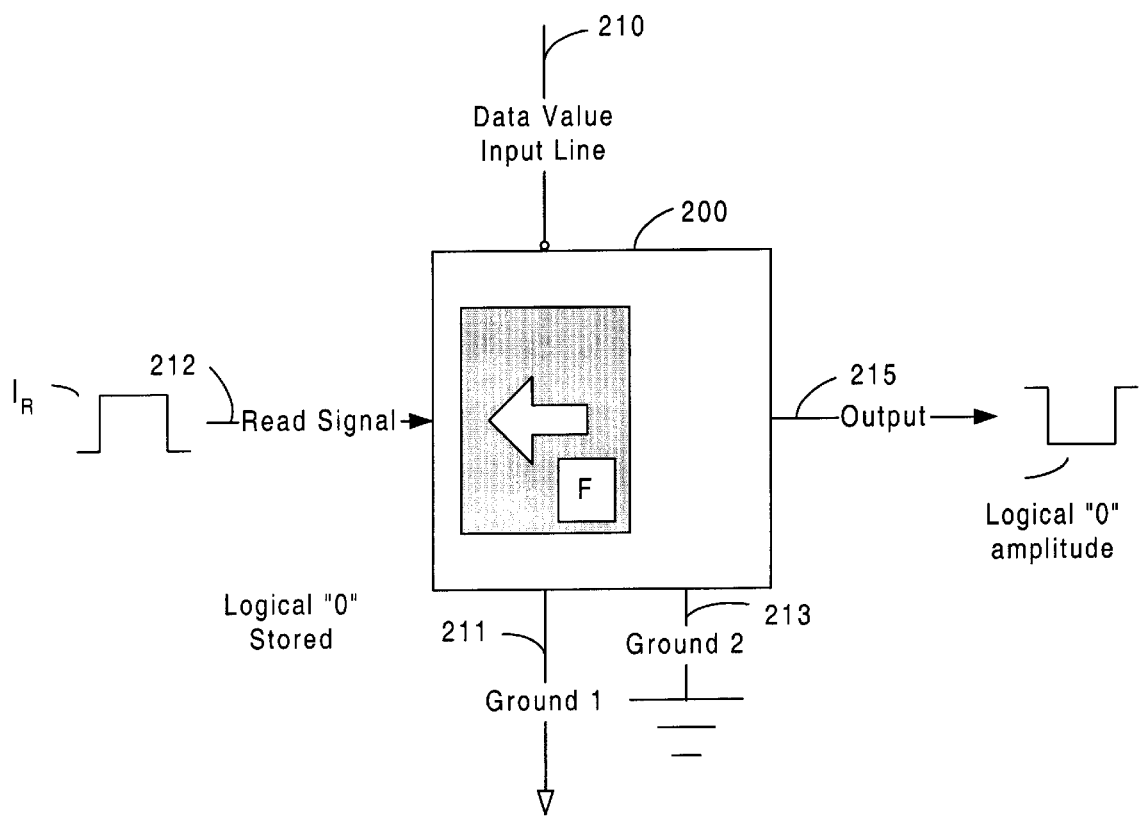

Looking next at FIG. 2b, the device state (which can be considered in a logical sense to be left in this case for a logical "0", but it is apparent that the nomenclature is reversible to correspond to a logical "1" instead) can be read out electrically by applying a current bias pulse $I_R$ (a read pulse) to a readout bias terminal 212. The bias pulse is grounded at ground 213, which may be identical with ground 1 or, most generally, is separate. When a positive polarity read pulse is applied to the readout terminal a voltage is developed at the readout (output) terminal 215, for the time duration of the bias pulse. For magnetization to the left, the readout voltage is intrinsically negative, but the device can incorporate a resistive offset to make the output zero (denoted by a zero). For magnetization to the right, the readout voltage is intrinsically positive, and the incorporation of a resistive offset will make the output positive with twice the intrinsic value (denoted by a "1").

It is also well-known that the write wire can also be inverted geometrically in which case a positive polarity write pulse (of appropriate magnitude) orients M to the left and a negative polarity write pulse orients M to the right. An identical effect could be achieved by using the original (non-inverted) write line structure with opposite polarity write pulses: in other words, a non-inverted structure with a negative write pulse can achieve the same result as an inverted structure with a positive polarity write pulse. In some instances it may be desirable to include both kinds of write layers coupled to the device as a means of avoiding the generation of negative current pulses.

It is also known, as explained in detail in my prior applications, that the ME devices include inherent beneficial storage and non-volatile features. This is because the magnetic orientation of F is bistable: once in a left or right orientation, it stays in that orientation (i.e., is non-volatile) until altered by a suitable field from a write pulse. As mentioned in my prior patents, it is also possible to use magnetic layers with more than two stable states so that a multi-level data value can be stored in such cell. Furthermore, ME devices are not susceptible to soft data errors induced sporadically and at random by background radiation (i.e., ME devices are relatively radiation hard).

ME Replacements for Conventional Memory Types

The following examples illustrate more clearly how the MEs of my prior applications can be advantageously employed to replace a variety of conventional memory types, including cache, primary, secondary and long-term storage varieties.

Figure 3A:
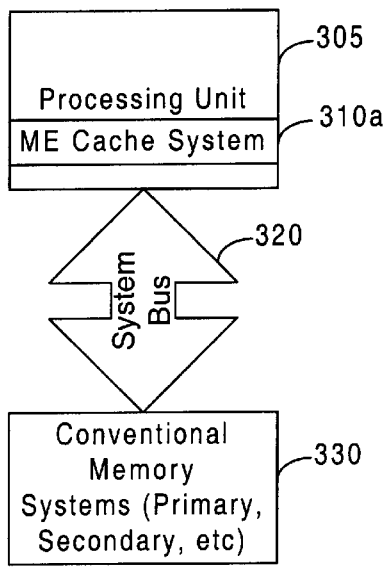
FIGS. 3a–3c are block diagrams illustrating a variety of implementations wherein magneto-electronic memories of the present type can be used for replacing conventional memory systems of the cache, primary and secondary variety.

First, as shown in FIG. 3a, an ME memory can be used onboard a conventional processing unit 305 as a cache memory 310a, in much the same way that conventional SRAM is configured for such purpose. My results from working with HHE prototypes of the type described in my prior patent U.S. Pat. No. 5,652,445, for example, reveal that such devices are capable of switching states at speeds of between 2 and 5 nanoseconds, and a read pulse applied to such devices results in a useful output at speeds of 1–3 nanoseconds or less. The manufacturing requirements for such devices are also not overly onerous, and it is within the skill in the art of semiconductor processing already based on my prior teachings to make such devices in densities of 200–300 megabits/cm$^2$ if not greater. This figure makes such devices well within the realm of useful and attractive non-volatile substitutes, therefore, for cache memories for computing systems. In addition, it is apparent that integration density of such cells will improve directly in step with advances in the microelectronics fabrication arts.

Other applications for the present invention include onboard a processing unit, such as in a bank of internal non-volatile registers. In principle, by using such ME memories for such purpose, a computing system constructed in accordance with the present invention would not require complicated or lengthy re-booting sequences as is necessary now in prior art systems. Any system registers containing operating system data, applications data, I/O information, stack information, program pointers, etc., could be implemented as ME registers so that such information could be used for an immediate boot-up of a system after power is applied. As operating systems, applications programs, device drivers and system memories increase in size, of course, this option becomes more and more attractive. Furthermore, avoiding a costly loss of system status data from a power interruption is another extremely beneficial advantage conferred by the present invention.

It is understood, of course, that if the magneto-electronic memories of the present invention are mixed with traditional semiconductor processing technologies, such as CMOS for example, that appropriate signal level shifting circuitry is required to interface the two technologies together. This type of level shifter is described in my prior patents as well (in the aforementioned U.S. Pat. No. 5,652,445 for instance) and is well-known from prior art circuits that converted TTL to CMOS logic signals for example. The remainder of the memory used in computing system 300 can include conventional memory 330 coupled to the processing unit 305 through a bus 320.

Figure 3B:
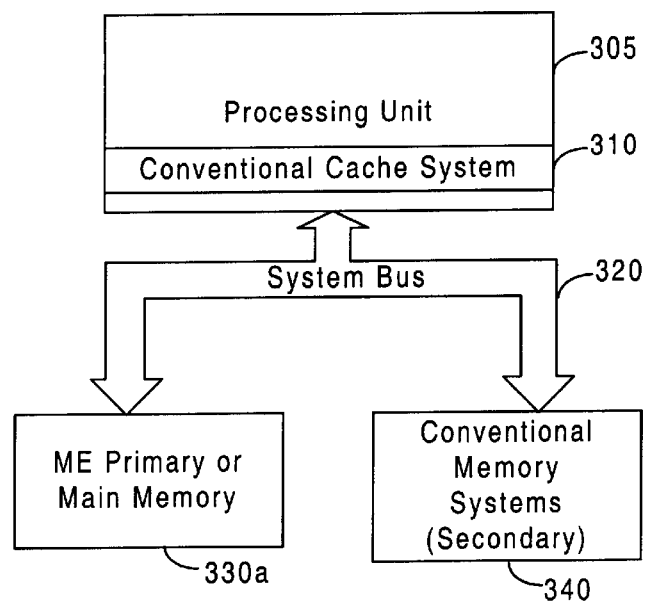
Figure 3C:
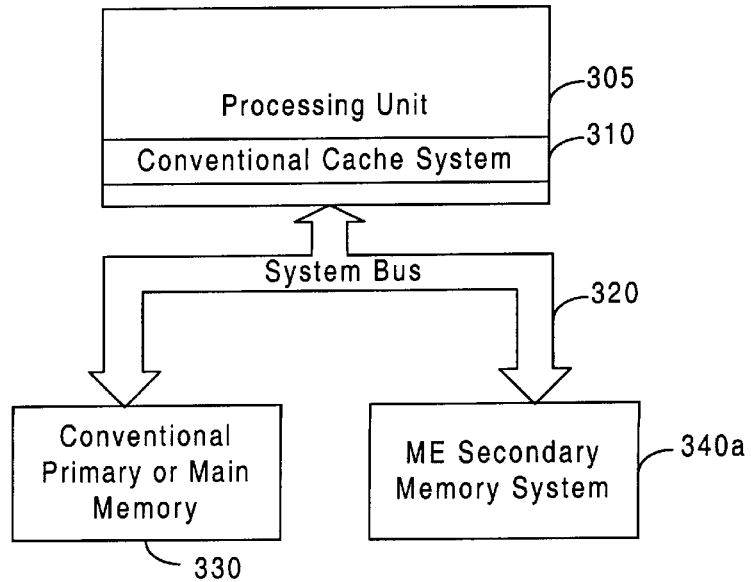

Similar replacements by ME devices of conventional memory systems are illustrated in FIGS. 3b and 3c. In FIG. 3b an ME memory can be incorporated as a standalone primary memory 330a, replacing conventional DRAM in this respect. In such an embodiment the processing difficulties associated with the FIG. 3a example may be somewhat ameliorated because an ME array of memory cells may be implemented in a separate die or package apart from other differing logic types. Any necessary logic signal conversion circuits could be implemented either directly onboard the ME device, or alternatively, in a separate driver. In this way, a modular approach may be utilized in the manner commonly used today in the industry for packaging and controlling banks of separate DRAMs. In other words, a series of one or more ME arrays could be mounted on a single small printed circuit board containing an integrated bus interface circuit (coupled to system bus 320) that includes appropriate level shifting circuitry. Computing system 300 could still include additional secondary and long term memory 340 comprised of such items as hard disks, floppy disks, CD ROMs, etc., for facilitating loading of new programs and data into ME main memory 330a for processing by the processing unit 305. Again, a pure ME type system memory confers an advantage in that the information is stored in non-volatile form and can be available immediately to facilitate boot-up of a system and to reduce redundant applications program loading from slower memory systems.

In FIG. 3c an ME memory can be incorporated as a standalone secondary memory 340a, replacing conventional hard drive technologies. For all practical purposes, this embodiment is essentially identical to the prior FIG. 3b embodiment, except that in systems it may be necessary to include some form of "emulation" to make ME memory 340a appear to have operational characteristics similar to hard drives. This type of interface circuit is common, for example, in PCMCIA flash cards, for example, which imitate hard drives to facilitate their inclusion in some contemporary computing systems. An example of this type of serial interface/bus controller circuit can be found in U.S. Pat. No. 5,535,328 which is incorporated by reference herein. Accordingly, this type of well-known circuit could be used with equal facility in the present invention in connection with an ME array to make the same appear as a conventional hard drive device.

Figure 4A:
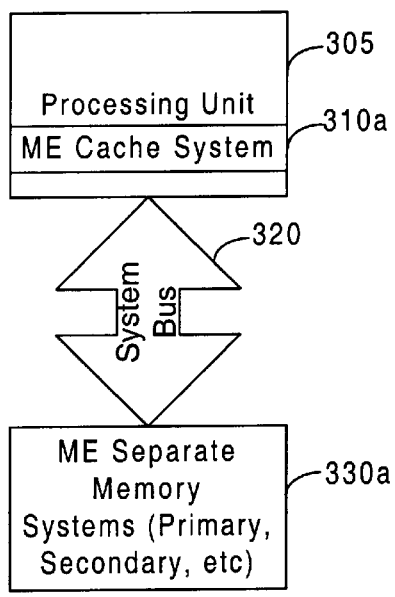
FIGS. 4a–4c are block diagrams illustrating a variety of implementations wherein magneto-electronic memories of the present type can be used for replacing more than one conventional memory system of the cache, primary and secondary variety either discretely or in integrated form.
Figure 4B:
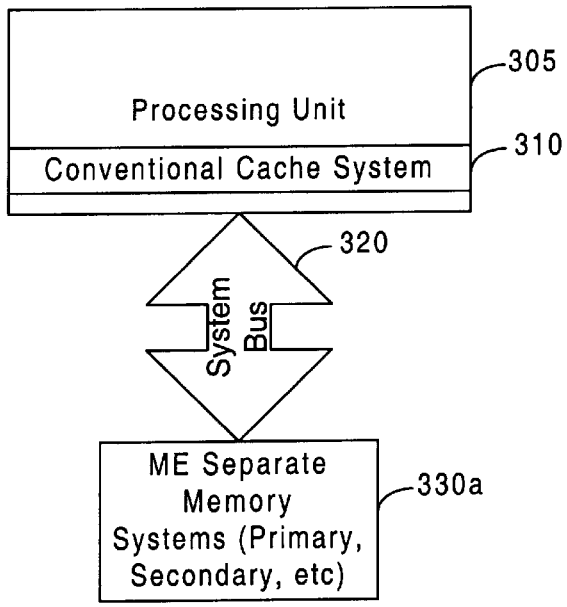
Figure 4C:
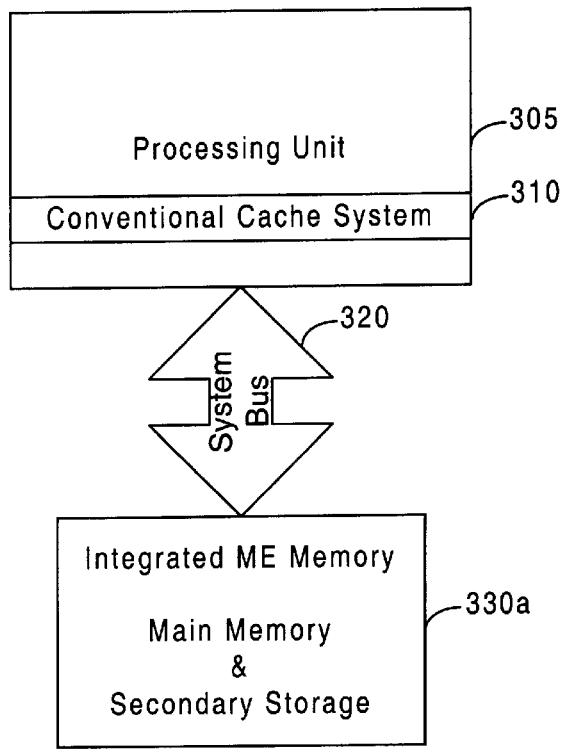

FIGS. 4a to 4c illustrate computing systems that include more than one level of ME memory. For example, in FIG. 4a, separate ME memories are used for cache 310a as well as for a number of other memory systems 330a (i.e, for a primary memory storage, secondary storage, long term storage, etc.) In FIG. 4b, a conventional cache is used (again because it may be more desirable in some environments) but separate ME memories are used for the remaining systems 330a, including primary, secondary, long term, etc.

Finally, in FIG. 4c, an integrated ME memory system is shown, in which a primary storage and secondary storage are combined in a single ME array. As the present ME arrays can be constructed with extremely high density, such an embodiment can achieve a high degree of performance and still be commercially practical. An array constructed in this fashion would first of all eliminate the need for the expense of a hard disk system, as well as the expense of another associated I/O interface between such hard disk and the processing unit in the computing system 300. Moreover, it would be substantially faster, denser, consume far less energy, and would be more robust since it is not vulnerable to mechanical failures such as head crashes. It is apparent that other portions of a typical memory could be "integrated" in this fashion in an ME array approach so as to consolidate a memory hierarchy to a single form of storage element. This approach has the additional advantage of eliminating additional I/O interfaces required by such separate forms of memory devices, and in reducing the complexity of memory controllers in such computing systems since they have fewer memory systems to contend with.

In contrast, however, to the integrated approach of FIG. 4c, the "separate" embodiment approach of FIG. 4b may have certain advantages in some environments. For example, it is apparent that ME arrays can be constructed in differing sizes, densities, speeds, performance, costs, etc. In some instances it may be more cost effective to utilize a smaller ME array having an extremely high performance (but relatively high cost per bit) as the main system memory, and a larger ME array having less impressive performance (but relatively small cost per bit) as the secondary storage system. In this manner, an overall memory hierarchy can be effectuated in a manner analogous to what is done in present day systems when balancing the mix and amount of cache, main and primary storage, except the present invention uses a technology (ME) with an inherently greater performance advantage.

These are but illustrations of some of the possibilities for the present ME memories, and other combinations will become apparent to those in the art based on the present disclosure. For example, such memories could be included in any number of conventional electronic devices as a replacement for SRAM, DRAM and Flash memories, including in hand-held computing devices, cellular telephones, printers, facsimile machines, televisions, modems, etc.

Figure 5:
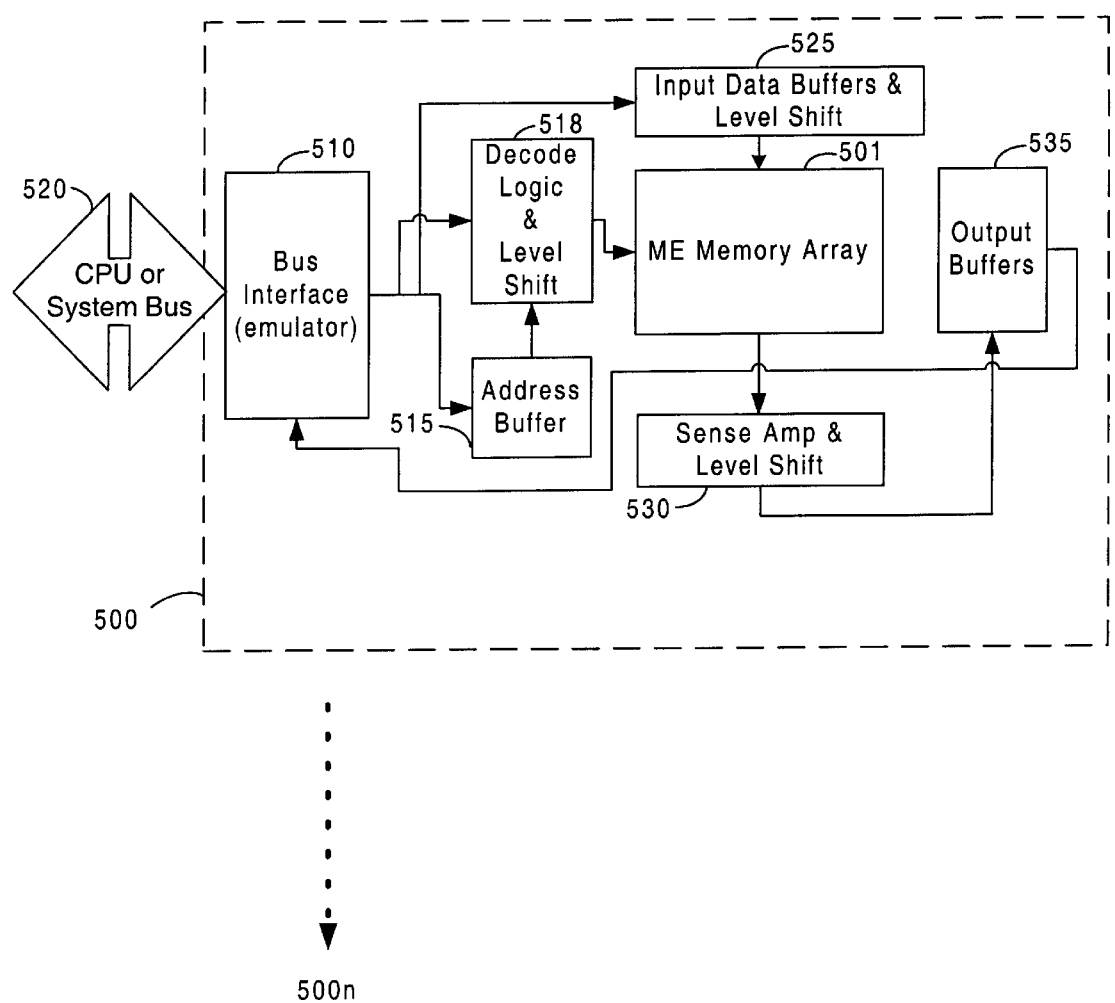
FIG. 5 is block diagram of a typical complete magneto-electronic memory device of the present invention as it may be used as any one or more of a cache, primary, and/or secondary memory.

A more detailed block diagram of a ME memory device of the present invention is provided in FIG. 5. Those skilled in the art will appreciate that with the exception of a specific level shifting circuit used to convert the signal levels used in these types of ME circuits to conventional semiconductor levels, the present invention essentially requires only the same bare essentials of access circuits commonly used and well known in other types of semiconductor random access memories such as DRAMs, SRAMs and Flash. As such their construction and operation are well-known in the art and need not be set out here in detail. In general, an ME device 500 having an array of ME cells 501 is coupled by way of a CPU bus (in the case of a cache implementation) or system bus 520 to a processing unit. A bus interface 510 coordinates access requests from the processing unit in the form of read and write commands to specific memory addresses corresponding to locations in array 501. Again, in environments where device 500 is intended as a hard disk replacement, suitable emulation logic as described above may also be included as part of the bus interface. In addition, the present device 500 may be synchronous or asynchronous depending on the particular application environment. After receiving a read request, for example, necessary address signals corresponding to a desired data location are stored in address buffer circuit 515. These signals are decoded in any one of many known ways in the art, and then transmitted to array 501. In the event the front end access logic circuits 510, 515 etc., are CMOS or some other process variant different from the ME array 501, the row and address control signals undergo suitable level conversion in circuit 518 as well to interface properly with such array. Array 501 can be constructed in any of a number of different variations most suited for the particular application. As noted in my prior patents, for example, in U.S. Pat. No. 5,565,695 it is most desirable to include some form of isolation between elements 200 such as shown in FIG. 2a (where the elements are not naturally self-isolating as for example with my previously disclosed ferromagnetic gated FET) and this can include a diode, FET, etc. When the appropriate memory cells are accessed, their data values are applied to sense circuit 530, which typically includes a number of sense amplifiers, and again, a level shift circuit amplifier to ensure sufficient signal drive for a subsequent logic stage. Again, these types of sense circuits 530 are known from conventional DRAM designs and may be constructed in any number of ways known in the art. The retrieved data values can then be latched into an output buffer 535 where they can be transmitted through bus interface 510 to the processing unit. The process of writing data to array 501 utilizes the same front end access circuits as above, and data values to be written are first stored in a data buffer 525. As with the decoding logic, the data buffers include level shifting logic if necessary to effectuate writing of the data into the appropriate memory location specified in an access request.

The above discussion merely explains the details of those circuits which are otherwise necessary to an understanding of the present invention. A number of additional circuits (control logic, system clocks, voltage and power generators, etc.) are typically included in such a memory system, but they are not pertinent to the present invention, and their nature and selection would be immediately apparent to one of skill in the art. Furthermore, while the present discussion is set out in the context of an I/O operation between a processing unit and the present ME memory devices, it should be apparent that the present ME devices would operate in conjunction with other peripheral devices on a system bus as well (such as printers, network controllers, etc.)

FIG. 5 also shows that a number of ME memory devices, 500, 500a . . . 500n may be coupled together either directly on the same printed circuit board (in the manner described above for single in-line memory modules (SIMMs) or dual in-line memory modules (DIMMs)) or on separate boards but connected through system bus 520. Such modules can be configured in any number of ways, and the only restriction is that the overall configuration must be compatible with the speed and bus width requirements of the system in which they are placed. Moreover, as suggested above, ME memory modules could be advantageously used in a number of conventional electronic devices, including hand-held computing devices, cellular telephones, printers, facsimile machines, televisions and modems to name a few.

Although the present invention has been described in terms of a preferred embodiment, it will be apparent to those skilled in the art that many alterations and modifications may be made to such embodiments without departing from the teachings of the present invention. Accordingly, it is intended that the all such alterations and modifications be included within the scope and spirit of the invention as defined by the appended claims.

What is claimed is:

1. A magneto-electronic memory for use in an electronic system, said memory comprising:
    a plurality of memory cells, each of the cells including a magnetic spin transistor for storing data values; and
    an access circuit coupled to said memory and said system so that the data values can be used by said system.

2. The memory of claim 1, wherein said memory is a cache coupled to a computing system for storing data and/or instructions recently used by such system.

3. The memory of claim 1, wherein said memory is a primary storage device for storing instructions and/or data that can be accessed for immediate processing by such system through a system bus.

4. The memory of claim 1, wherein said memory is comprised of two or more modules of magnetic memory, each of the modules including an array of magnetic spin transistor memory cells for storing data values and an associated access circuit coupled to said memory and said system so that the data values can be provided to said system.

5. The memory of claim 1, wherein said memory is a secondary storage device for storing programs and/or data which can be loaded into a system memory and then accessed by a computing system.

6. The memory of claim 4, wherein the access circuit also operates to emulate a magnetic hard disk interface so that the computing system perceives such memory as a magnetic hard disk.

7. The memory of claim 2, further including an array of memory cells for use as a primary storage device, each of the cells including a magnetic spin transistor for storing data values corresponding to instructions and/or data that can be accessed for immediate processing by such system.

8. The memory of claim 1, wherein said memory is a primary storage device for storing data values corresponding to instructions and/or data that can be accessed for immediate processing by such system, and said system further includes a cache memory system.

9. The memory of claim 2, wherein said memory is an integrated memory and further includes a primary storage device comprised of a magnetic spin transistor array for storing instructions and/or data that can be accessed for immediate processing by such system.

10. The memory of claim 9 wherein said memory further includes a secondary storage device comprised of a magnetic spin transistor array for storing programs and data which can be loaded into the primary storage device and then accessed by such system.

11. The memory of claim 3, wherein said memory is an integrated memory and further includes a secondary storage device comprised of a magnetic spin transistor array for storing programs and data which can be loaded into the primary storage device and then accessed by such system.

12. The memory of claim 11, wherein the primary storage device includes a data access time substantially less than that for the secondary storage device.

13. The memory of claim 1, wherein said memory is comprised of one or more registers used by said system.

14. The memory of claim 1, wherein the data values can be read from such cells in less than 5 nanoseconds.

15. The memory of claim 1, wherein the data values can be written to such cells in less than 5 nanoseconds.

16. The memory of claim 1, wherein the integration density of such cells is greater than 200 megabits/cm$^2$.

17. The memory of claim 1, wherein the array further includes isolation elements for the memory cells.

18. The memory of claim 1, wherein the memory cells store data values corresponding to one of n possible values, where n>2.

19. The memory of claim 1, wherein the access circuit includes logic level shifting circuitry for interfacing said memory with said system.

20. The memory of claim 19, wherein the access circuit further includes an interface circuit for coordinating accesses to and from said memory and said system.

21. The memory of claim 20, wherein the access circuit further includes address decoding logic for determining a location in the memory array corresponding to an access request by said system.

22. The memory of claim 1, wherein said memory is configured for use in a portable electronic device.

23. A method of providing a magneto-electronic memory for use in an electronic system, said method comprising the steps of:

(a) providing a plurality of memory cells, each of the cells including a magnetic spin transistor for storing data values; and (b) accessing said cells so that the data values can be provided to said system.

24. The method of claim 23, wherein said memory stores data and/or instructions recently used by a computing system.

25. The method of claim 23, wherein said memory is a primary array that stores instructions and/or data that can be accessed for immediate processing by such system through a system bus.

26. The method of claim 24, further including a step of providing a primary array of memory cells, each of the cells including a magnetic spin transistor for storing data values corresponding to instructions and/or data that can be accessed for immediate processing by such system.

27. The method of claim 25 further including a step of providing a secondary array of memory cells, each of the cells including a magnetic spin transistor for storing programs and data which can be loaded into the primary array and then accessed by such system.

28. The method of claim 27, wherein the primary array includes a data access time substantially less than that for the secondary array.

29. The method of claim 23, wherein the data values can be read from such cells in less than 5 nanoseconds.

30. The method of claim 23, wherein the integration density of such cells is greater than 200 megabits/cm$^2$.

31. The method of claim 23, further including a step of providing isolation elements for the memory cells.

32. The method of claim 23, wherein the memory cells store data values corresponding to one of n possible values, where n>2.

33. The method of claim 23, further including a step of interfacing said memory with said computing system using a logic level shifting circuit.

34. The method of claim 23, wherein said memory is configured for use in a portable electronic device.

35. A magneto-electronic memory for use in an electronic system, said memory comprising:

a plurality of memory cells, each of the cells including a hybrid hall effect element for storing data values, each of said hall effect elements including:

(i) a conductive film layer having a surface and capable of carrying an electrical current;

(ii) a ferromagnetic layer having a configurable magnetization orientation, and coupled to such surface such that a fringe magnetic field substantially normal to such surface can be generated by an edge portion of the ferromagnetic layer; and wherein an electrical signal indicative of the data value stored in such element can be generated in response to the fringe magnetic field acting on a substantial portion of the electrical current in the conductive film layer; and an access circuit coupled to said memory and said system so that the data values can be used by said system.

36. The memory of claim 35, wherein said memory is a cache coupled to a computing system for storing data and/or instructions recently used by such system.

37. The memory of claim 35, wherein said memory is a primary storage device for storing instructions and/or data that can be accessed for immediate processing by such system through a system bus.

38. The memory of claim 35, wherein said memory is comprised of two or more modules of hybrid hall effect memory, each of the modules including an array of hybrid hall effect elements cells for storing data values and an associated access circuit coupled to said memory and said system so that the data values can be provided to said system.

39. The memory of claim 35, wherein said memory is a secondary storage device for storing programs and/or data which can be loaded into a system memory and then accessed by a computing system.

40. The memory of claim 38, wherein the access circuit also operates to emulate a magnetic hard disk interface so that the computing system perceives such memory as a magnetic hard disk.

41. The memory of claim 36, further including an array of memory cells for use as a primary storage device, each of the cells including a hybrid hall effect element for storing data values corresponding to instructions and/or data that can be accessed for immediate processing by such system.

42. The memory of claim 35, wherein said memory is a primary storage device for storing data values corresponding to instructions and/or data that can be accessed for immediate processing by such system, and said system further includes a cache memory system.

43. The memory of claim 36, wherein said memory is an integrated memory and further includes a primary storage device comprised of a hybrid hall effect element array for storing instructions and/or data that can be accessed for immediate processing by such system.

44. The memory of claim 43 wherein said memory further includes a secondary storage device comprised of a hybrid hall effect element array for storing programs and data which can be loaded into the primary storage device and then accessed by such system.

45. The memory of claim 38, wherein said memory is an integrated memory and further includes a secondary storage device comprised of a hybrid hall effect element array for storing programs and data which can be loaded into the primary storage device and then accessed by such system.

46. The memory of claim 45, wherein the primary storage device includes a data access time substantially less than that for the secondary storage device.

47. The memory of claim 35, wherein said memory is comprised of one or more registers used by said system.

48. The memory of claim 35, wherein the data values can be read from such cells in less than 5 nanoseconds.

49. The memory of claim 35, wherein the data values can be written to such cells in less than 5 nanoseconds.

50. The memory of claim 35, wherein the integration density of such cells is greater than 200 megabits/cm$^2$.

51. The memory of claim 35, wherein the array further includes isolation elements for the memory cells.

52. The memory of claim 35, wherein the memory cells store data values corresponding to one of n possible values, where n>2.

53. The memory of claim 35, wherein the access circuit includes logic level shifting circuitry for interfacing said memory with said system.

54. The memory of claim 53, wherein the access circuit further includes an interface circuit for coordinating accesses to and from said memory and said system.

55. The memory of claim 54, wherein the access circuit further includes address decoding logic for determining a location in the memory array corresponding to an access request by said system.

56. The memory of claim 35, wherein said memory is configured for use in a portable electronic device.

57. A method of providing a magneto-electronic memory for use in an electronic system, said method comprising the steps of:

(a) providing a plurality of memory cells, each of the cells including a hybrid hall effect element for storing data values, each of said elements including:
   (i) a conductive film layer having a surface and capable of carrying an electrical current; and
   (ii) a ferromagnetic layer having a configurable magnetization orientation, and coupled to such surface such that a fringe magnetic field substantially normal to such surface can be generated by an edge portion of the ferromagnetic layer; and
   wherein an electrical signal indicative of the data value stored in such element can be generated in response to the fringe magnetic field acting on a substantial portion of the electrical current in the conductive film layer; and
(b) accessing said cells so that the data values can be provided to said system.

58. The method of claim 57, wherein said memory stores data and/or instructions recently used by a computing system.

59. The method of claim 57, wherein said memory is a primary array that stores instructions and/or data that can be accessed for immediate processing by such system through a system bus.

60. The method of claim 58, further including a step of providing a primary array of memory cells, each of the cells including a hybrid hall effect element for storing data values corresponding to instructions and/or data that can be accessed for immediate processing by such system.

61. The method of claim 59 further including a step of providing a secondary array of memory cells, each of the cells including a hybrid hall effect element for storing programs and data which can be loaded into the primary array and then accessed by such system.

62. The method of claim 61, wherein the primary array includes a data access time substantially less than that for the secondary array.

63. The method of claim 57, wherein the data values can be read from such cells in less than 5 nanoseconds.

64. The method of claim 57, wherein the integration density of such cells is greater than 200 megabits/cm$^2$.

65. The method of claim 57, further including a step of providing isolation elements for the memory cells.

66. The method of claim 57, wherein the memory cells store data values corresponding to one of n possible values, where n>2.

67. The method of claim 57, further including a step of interfacing said memory with said computing system using a logic level shifting circuit.

68. The method of claim 57, wherein said memory is configured for use in a portable electronic device.

* * * * *